US010170625B2

(12) United States Patent
Toh et al.

(10) Patent No.: US 10,170,625 B2
(45) Date of Patent: Jan. 1, 2019

(54) METHOD FOR MANUFACTURING A COMPACT OTP/MTP TECHNOLOGY

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 2 days.

(21) Appl. No.: 15/410,848

(22) Filed: Jan. 20, 2017

(65) Prior Publication Data

US 2018/0212058 A1 Jul. 26, 2018

(51) Int. Cl.
H01L 29/78 (2006.01)
H01L 27/112 (2006.01)
H01L 23/525 (2006.01)
H01L 29/66 (2006.01)
H01L 21/84 (2006.01)

(52) U.S. Cl.
CPC ........ H01L 29/7855 (2013.01); H01L 21/845 (2013.01); H01L 23/5252 (2013.01); H01L 27/11206 (2013.01); H01L 29/6656 (2013.01); H01L 29/66545 (2013.01); H01L 29/66795 (2013.01)

(58) Field of Classification Search
CPC ............... H01L 29/7855; H01L 21/845; H01L 29/66795; H01L 27/0924; H01L 21/823821; H01L 27/0886; H01L 29/785; H01L 21/823431; H01L 29/7851; H01L 27/1203; H01L 27/0688; H01L 27/1211; H01L 27/11206; H01L 29/66886; H01L 29/66545; H01L 29/0673; H01L 29/7881
See application file for complete search history.

(56) References Cited

U.S. PATENT DOCUMENTS

| | | | | |
|---|---|---|---|---|
| 2006/0281253 A1* | 12/2006 | Yelehanka | ........ | H01L 21/76895 438/253 |
| 2015/0054090 A1* | 2/2015 | Or-Bach | ................ | G11C 16/02 257/401 |
| 2015/0243667 A1* | 8/2015 | Liaw | ................... | H01L 27/1104 257/390 |

OTHER PUBLICATIONS

Pan et al. "1Kbit FINFET Dielectric (FIND) RRAM in Pure 16nm FinFET CMOS Logic Process", Microelectronics Laboratory, Institute of Electronics Engineering, 2015, 4 pages.

(Continued)

Primary Examiner — Khiem D Nguyen
(74) Attorney, Agent, or Firm — Ditthavong & Steiner, P.C.

(57) ABSTRACT

Methods of forming a compact FinFET OTP/MTP cell and a compact FDSOI OTP/MTP cell and resulting devices are provided. Embodiments include providing a substrate having a BOX layer; forming fins on the BOX layer with a gap in between; forming first and second gates, laterally separated, over and perpendicular to the fins; forming at least one third gate between the first and second gates and contacting the BOX layer through the gap, each third gate overlapping an end of a fin or both fins; forming a S/D region in each of the fins adjacent to the first and second gates, respectively, remote from the at least one third gate; utilizing each of the first and second gates as a WL; utilizing each third gate as a SL or connecting a SL to the S/D region; and connecting a BL to the S/D region or the at least one third gate.

17 Claims, 13 Drawing Sheets

(56) References Cited

OTHER PUBLICATIONS

Hsiao et al. "A New High-Density Twin-Gate Isolation One-Time Programmable Memory Cell in Pure 28-nm CMOS Logic Process", IEEE Transaction on electron devices, vol. 62, No. 1, Jan. 2015, 121-127, 7 Pages.

* cited by examiner

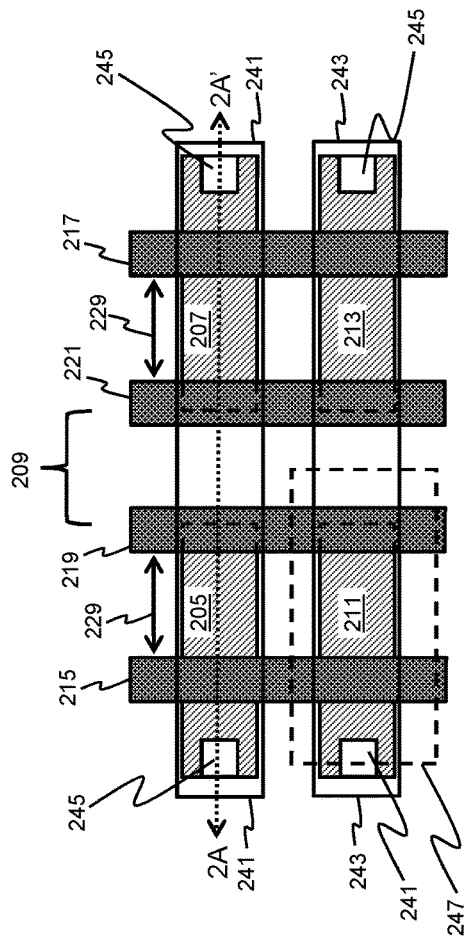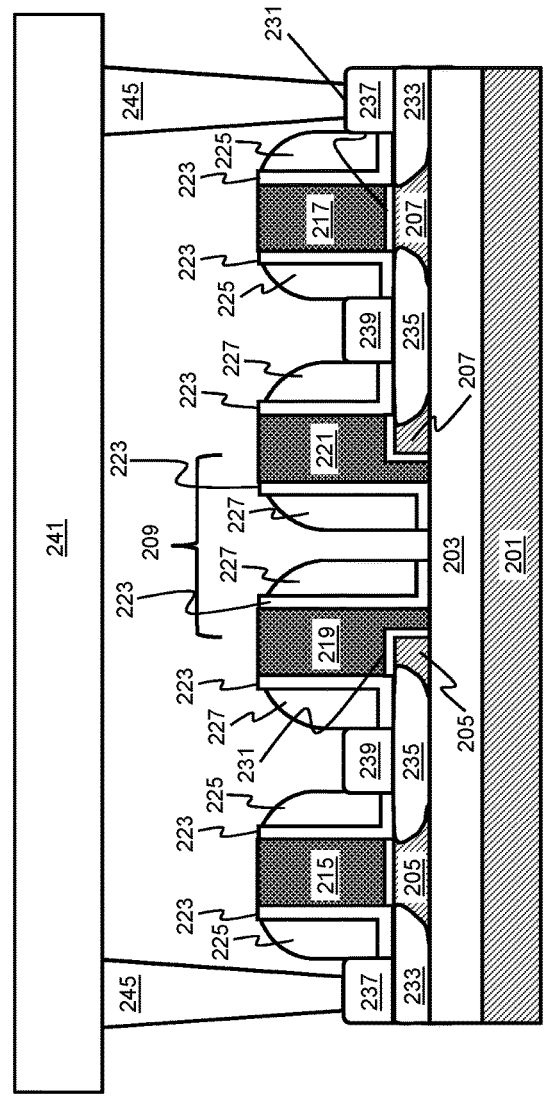
FIG. 2B
FIG. 2A

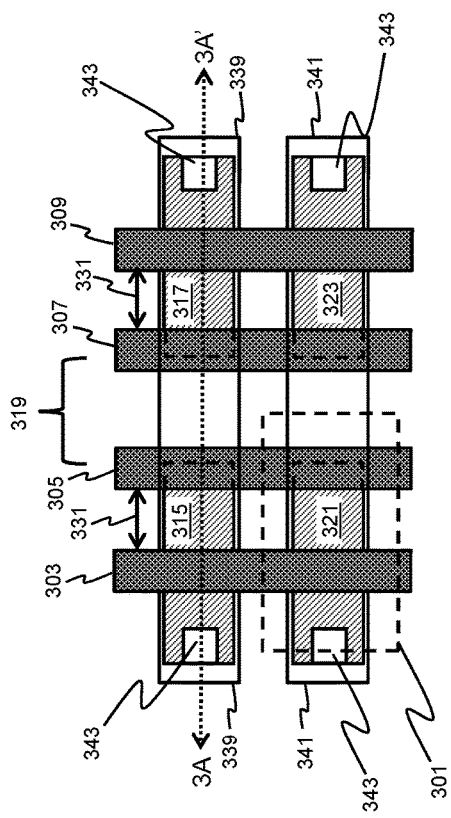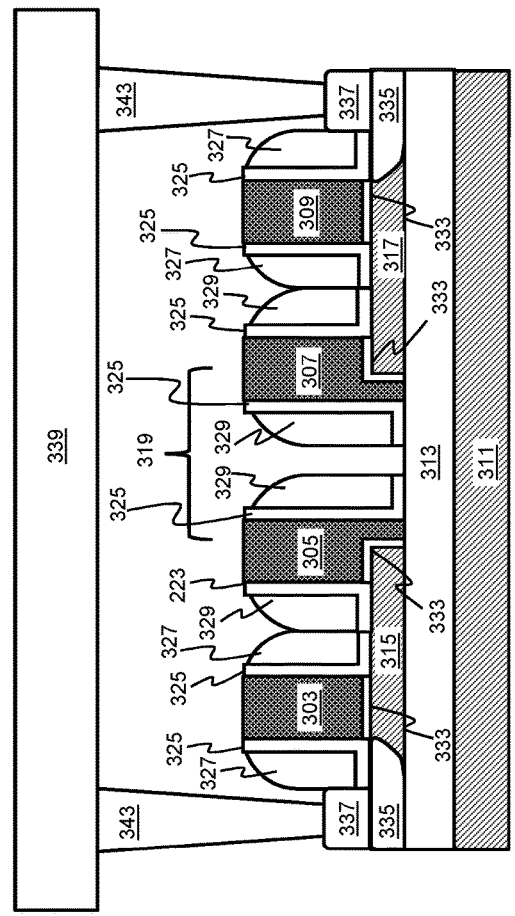

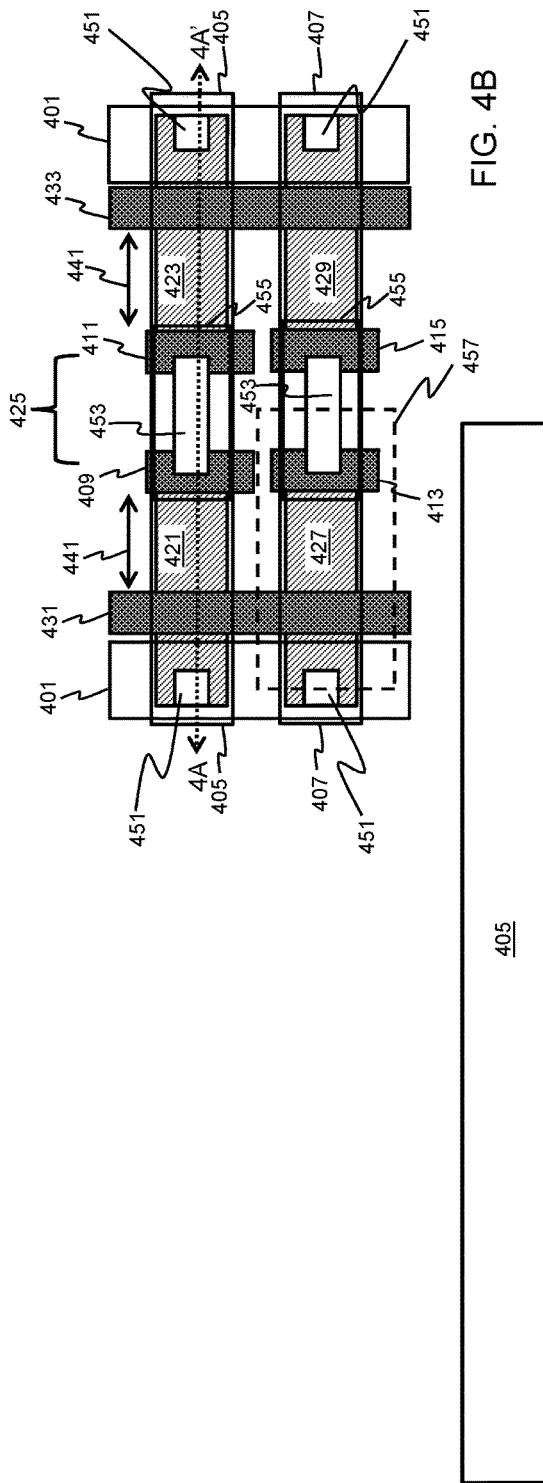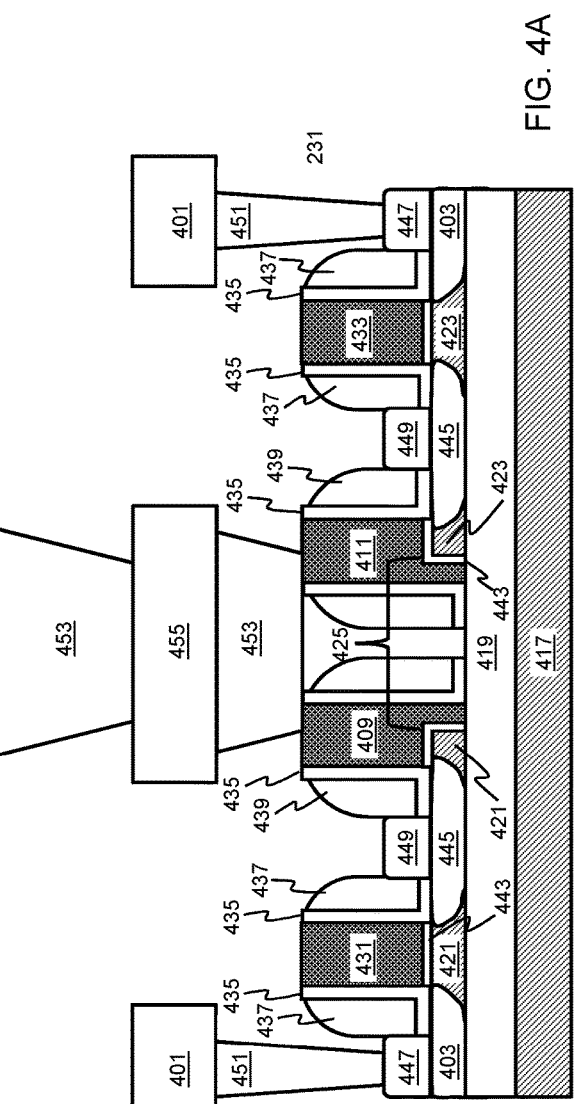
FIG. 4B
FIG. 4A

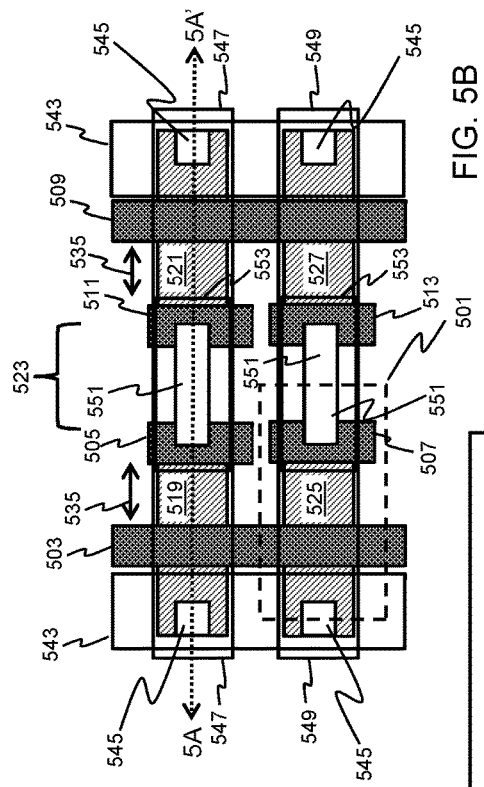
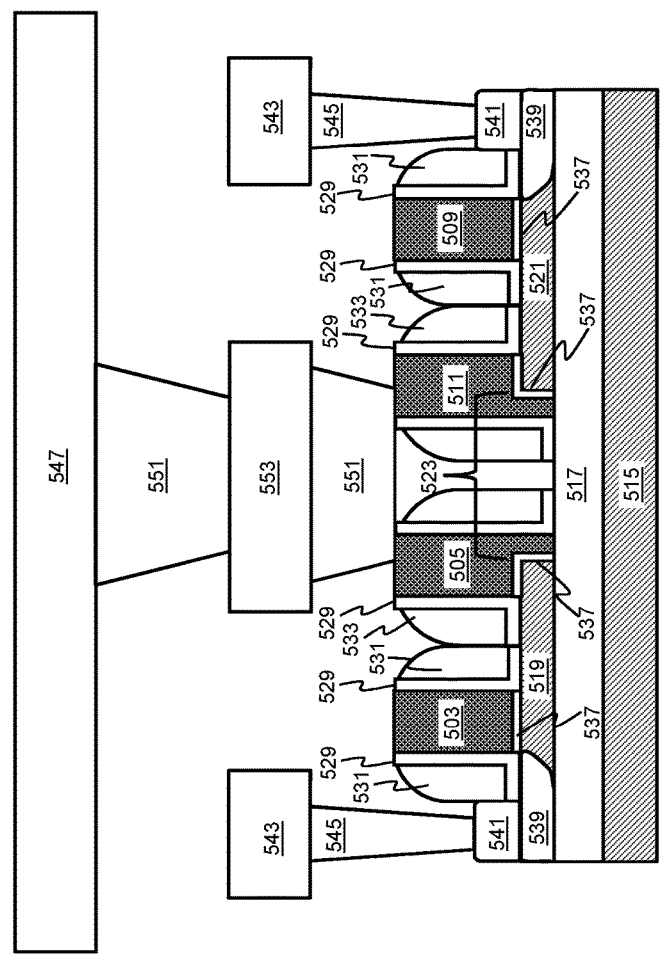
FIG. 5A
FIG. 5B

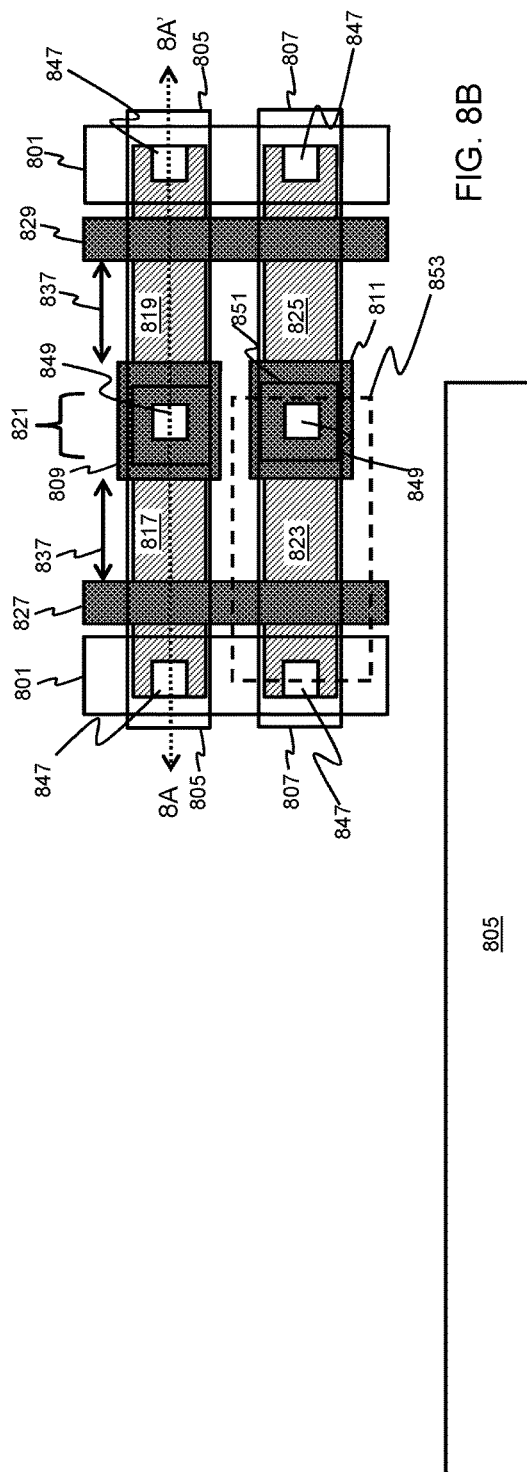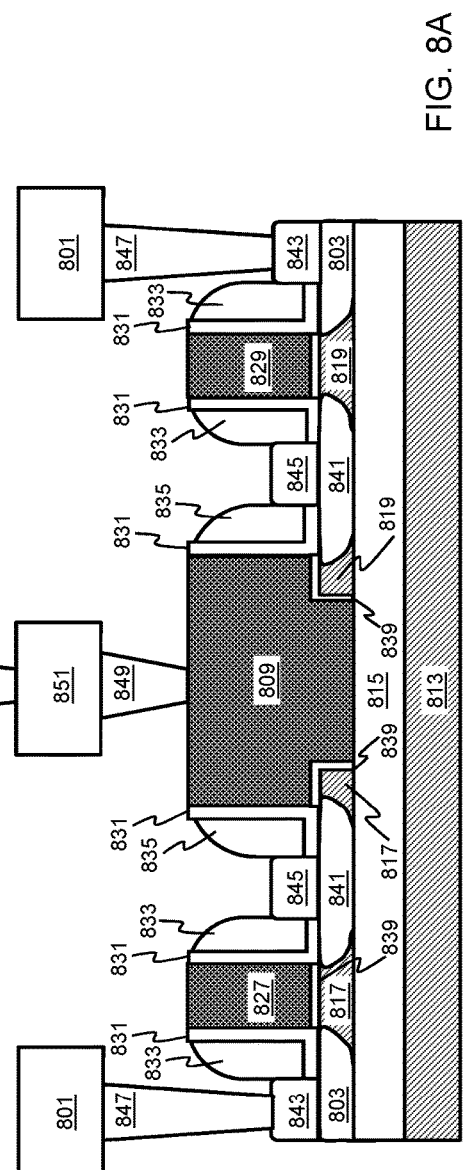
FIG. 8B
FIG. 8A

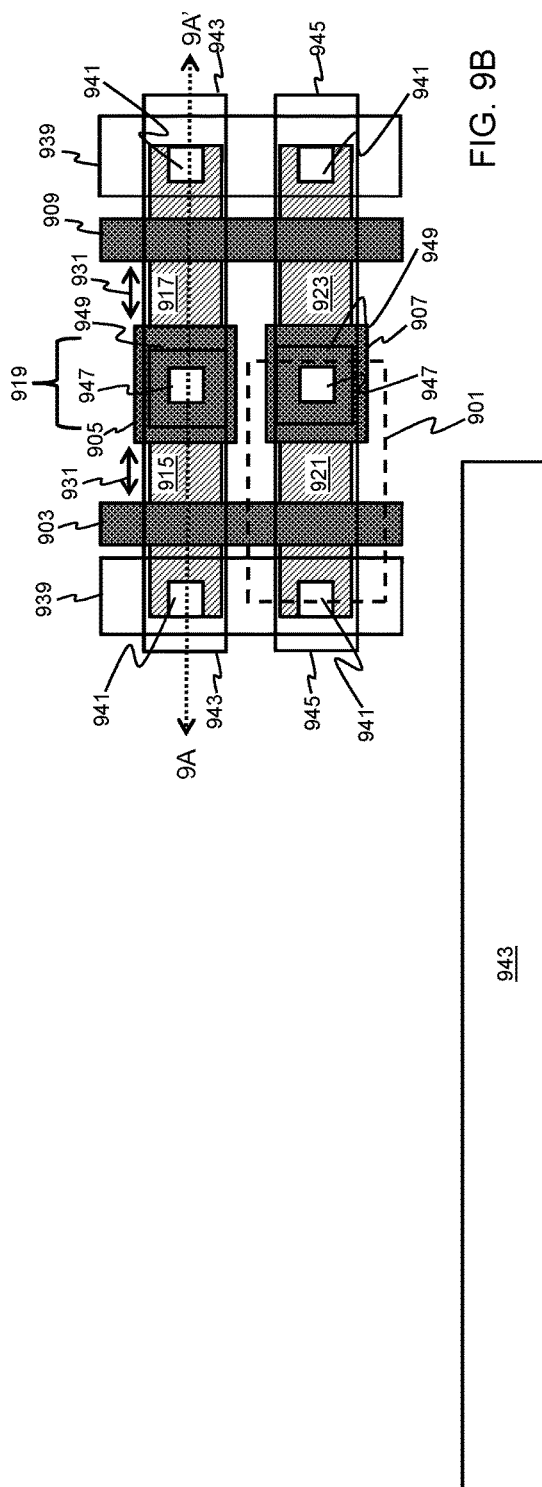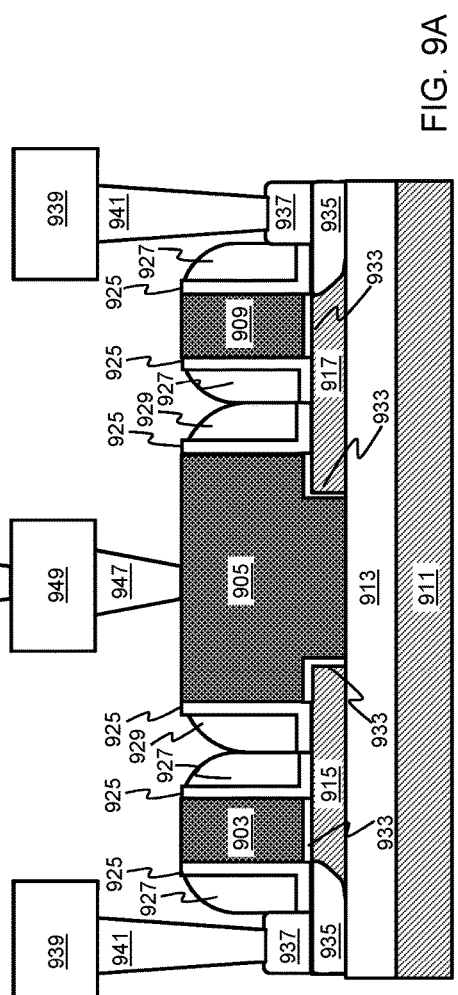
FIG. 9B
FIG. 9A

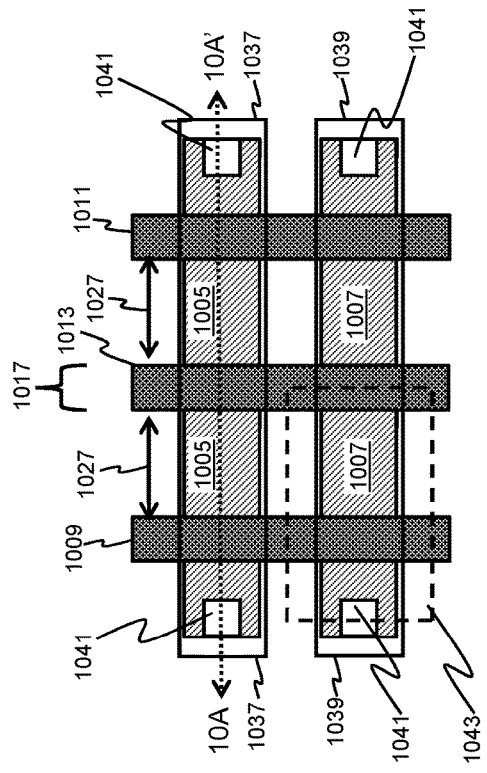
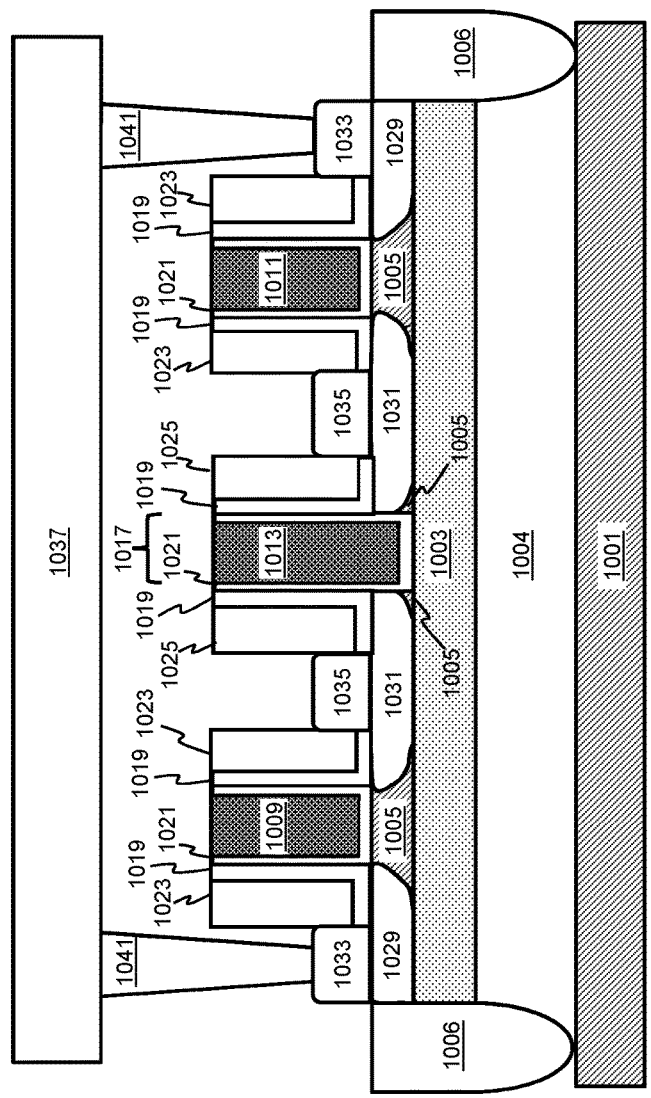
FIG. 10B
FIG. 10A

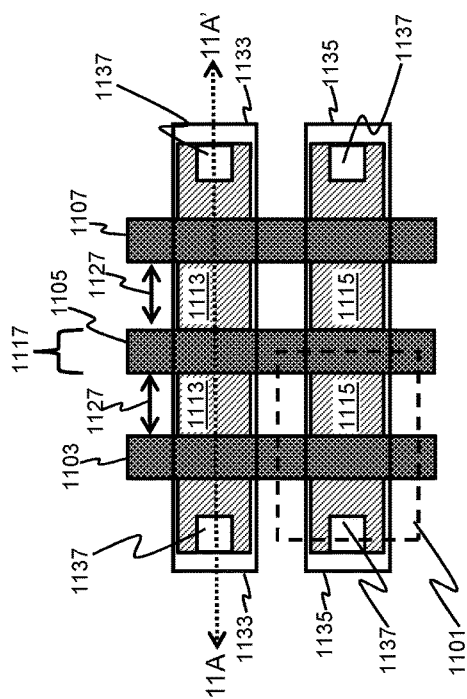
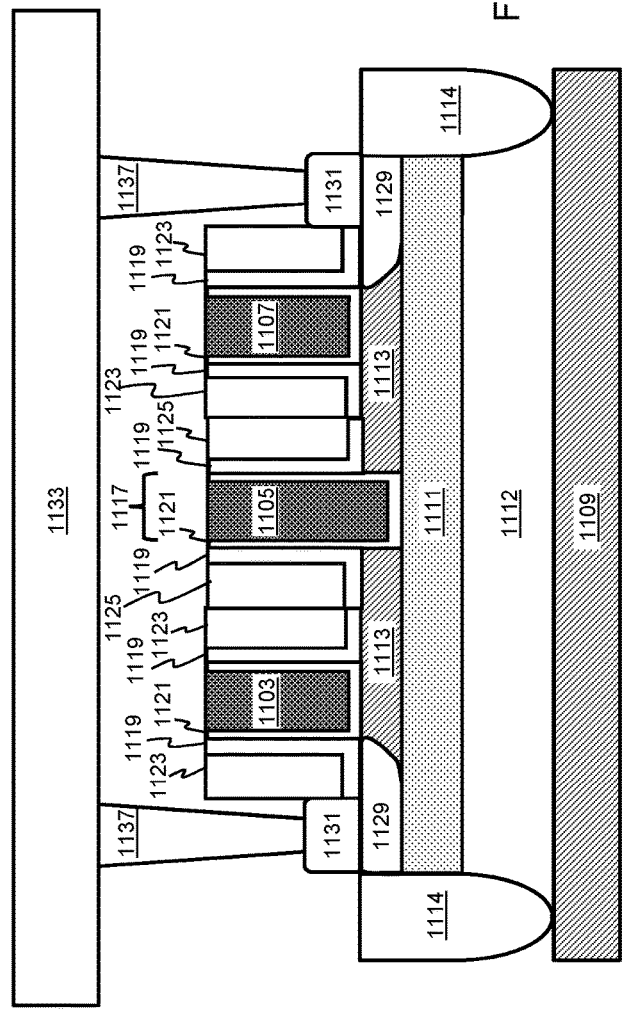
FIG. 11B
FIG. 11A

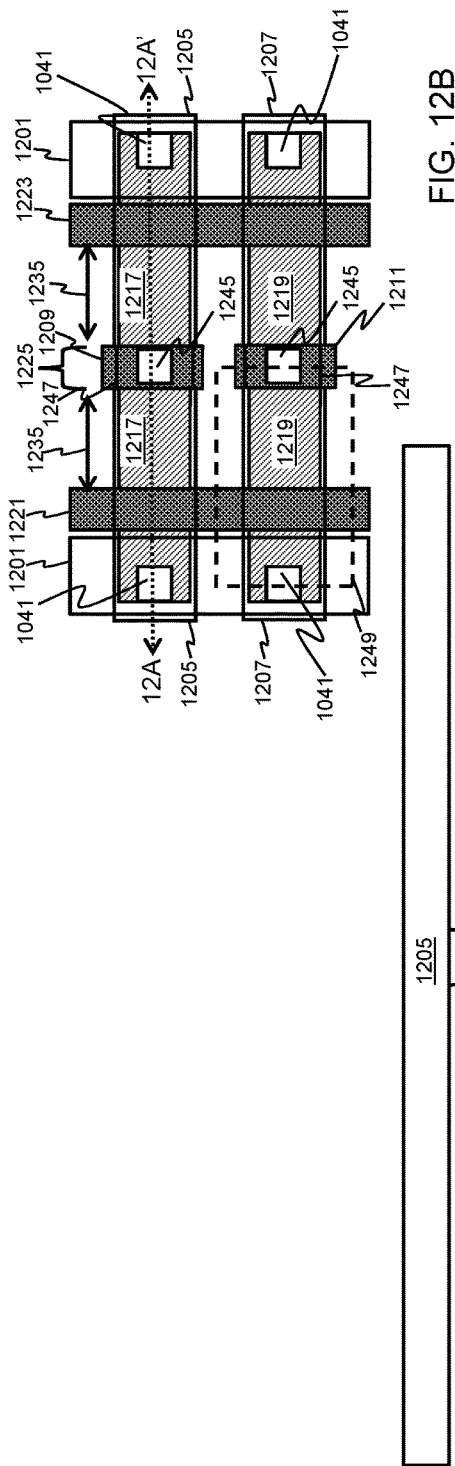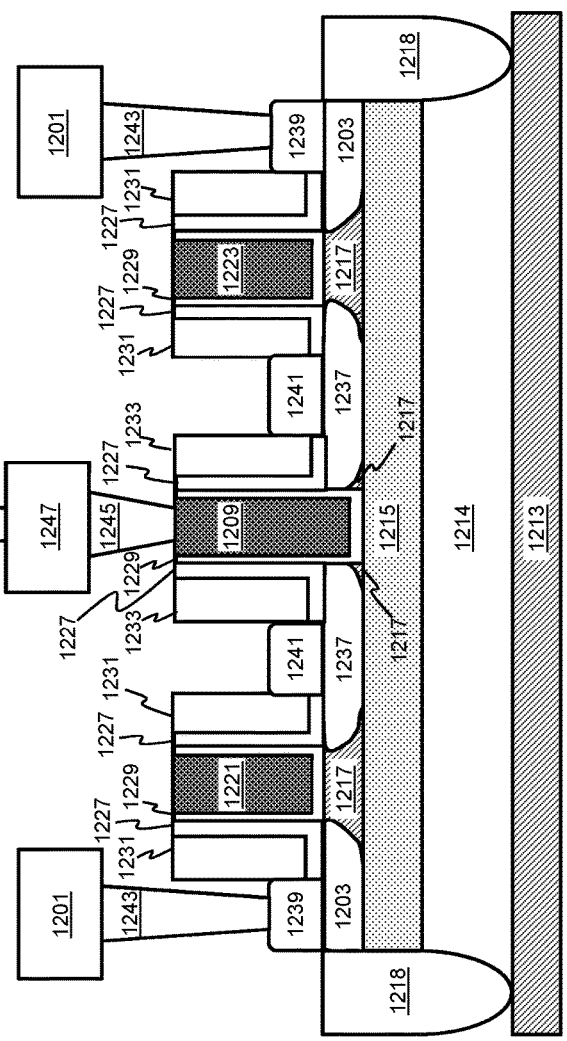
FIG. 12B
FIG. 12A

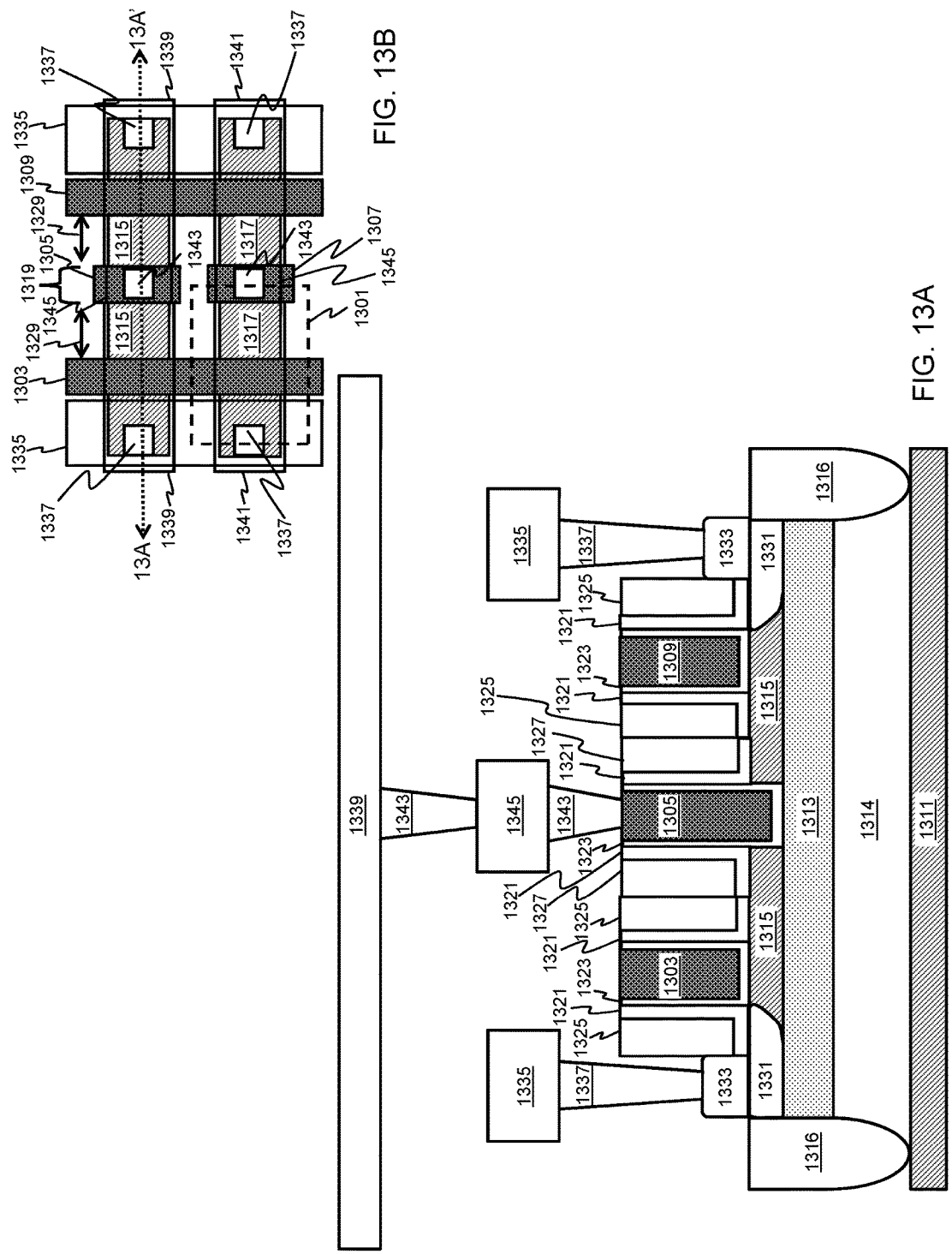

METHOD FOR MANUFACTURING A COMPACT OTP/MTP TECHNOLOGY

TECHNICAL FIELD

The present disclosure relates to memory design for semiconductor devices. The present disclosure is particularly applicable to fabricating compact one-time programmable (OTP) and multiple-time programmable (MTP) memory devices.

BACKGROUND

A known high-density anti-fuse twin-gate isolation (TGI) OTP memory cell realized in 28 nanometer (nm) high-K metal gate (HKMG) complementary metal oxide semiconductor (CMOS) logic process is shown in FIG. 1. Adverting to FIG. 1 (cross-sectional view) the known design includes gates 101 and 103 formed on a p-type well (PW) 105. Each gate 101 and 103 includes a dielectric layer 107, an L-shaped liner 109, and spacers 111. In addition, n+ doped source/drain (S/D) regions 113 and 115 are formed in the substrate 105 adjacent to the gates 101 and a p+ doped S/D region 117 is formed in the substrate 105 between the gates 103. Further, the gates 101 are each utilized as a word line (WL), e.g., $WL_n$ and $WL_{n+1}$, the gates 103 are each utilized as a source line (SL), e.g., $SL_n$ and $SL_{n+1}$, and the n+ doped S/D regions 113 are connected to a bit line (BL) (all not shown for illustrative convenience). The length of the gates 103 needs to be large enough for the p+ implant alignment and the space between the gates 103 needs to be large enough for the p+ doped S/D region 117 to form. However, known challenges to this design include an observed program disturb issue due to potential contour distribution, and reducing the program disturb with a p+ implant results in a larger cell size. A 1 Kbit fin-type field effect transistor (FinFET) dielectric (FIND) resistive random-access memory (RRAM) realized in a 16 nm FinFET CMOS logic process or 16 nm MTP cell is also known. The known MTP cell has a very low set voltage and reset current due to the field enhancement on fin corners; however, a reduction of the cell size is desirable.

A need therefore exists for methodology enabling formation of a compact OTP/MTP cell for high packing density that reduces program disturb/interference and the resulting device.

SUMMARY

An aspect of the present disclosure is a method of forming a compact FinFET OTP/MTP cell.

Another aspect of the present disclosure is a method of forming a compact fully depleted silicon on insulator (FD-SOI) OTP/MTP cell.

A further aspect of the present disclosure is a compact FinFET OTP/MTP device and a compact FDSOI OTP/MTP device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a substrate having a buried oxide (BOX) layer formed over the substrate; forming first and second fins on the BOX layer end to end with a gap in between; forming first and second gates, laterally separated, over and perpendicular to the first and second fins, respectively; forming at least one third gate between the first and second gates and contacting the BOX layer through the gap, each third gate overlapping an end of the first fin, the second fin, or both fins; forming a S/D region in each of the first and second fins adjacent to the first and second gates, respectively, remote from the at least one third gate; utilizing each of the first and second gates as a WL; utilizing each at least one third gate as a SL or connecting a SL to the S/D region; and connecting a BL to the S/D region or the at least one third gate.

Aspects of the present disclosure include the at least one third gate being formed of two third gates separated from each other. Other aspects include forming an L-shaped liner on each sidewall of each first, second, and third gate; forming a first spacer on each L-shaped liner of the first and second gates; and forming a second spacer on each L-shaped liner of each third gate. Further aspects include separating the second spacers from the first spacers; and forming source/drain regions between each third gate and the adjacent first and second gates. Additional aspects include forming the first and second spacers with no gap in between. Another aspect includes the at least one third gate being formed of a single merged gate filling the gap and overlapping an end of each of the first and second fins. Other aspects include forming at least one additional pair of first and second fins parallel to and vertically spaced from the first pair of fins; extending the first and second gates over one or more of the additional first and second fins, respectively; and extending the at least one third gate over the one or more additional pairs of first and second fins. Further aspects include forming at least one additional pair of first and second fins parallel to and vertically spaced from the first pair of fins; extending the first and second gates over one or more of the additional first and second fins, respectively; and forming an additional at least one third gate over each of the one or more additional pairs of first and second fins.

Another aspect of the present disclosure is device including: a substrate having a BOX layer formed over the substrate; first and second fins formed on the BOX layer end to end with a gap in between; first and second gates, laterally separated, formed over and perpendicular to the first and second fins, respectively; at least one third gate formed between the first and second gates on the BOX layer through the gap, each third gate overlapping an end of the first fin, the second fin, or both fins; a S/D region formed in each of the first and second fins adjacent to the first and second gates, respectively, remote from the at least one third gate; a WL connected to each of the first and second gates; and a BL connected to the S/D region or the third gate.

Aspects of the device include each of the first and second gates being utilized as a WL and each third gate being utilized as a SL or a SL being connected to the S/D region. Another aspect includes the at least one third gate being formed of two third gates separated from each other. Other aspects include an L-shaped liner on each sidewall of each first, second, and third gate; a first spacer on each L-shaped liner of the first and second gates; and a second spacer on each L-shaped liner of each third gate. Further aspects include wherein the second spacers are separated from the first spacers, source/drain regions are formed between each third gate and the adjacent first and second gates. Additional aspects include the first and second spacers being formed with no gap in between. Another aspect includes the at least one third gate being formed of a single merged gate filling the gap and overlapping an end of each of the first and second fins. Other aspects include at least one additional pair of first and second fins parallel to and vertically spaced from the first pair of fins, the first and second gates extending over one or more of the additional first and second fins, respectively, and the at least one third gate extending over the one or more additional pairs of first and second fins. Further aspects include at least one additional pair of first and second fins parallel to and vertically spaced from the first pair of fins, the first and second gates extending over one or more of the additional first and second fins, respectively, and an additional at least one third gate over each of the one or more additional pairs of first and second fins.

A further aspect of the present disclosure is method including: providing a substrate having a BOX layer formed over the substrate; forming a cavity between the substrate and the BOX layer and between a pair of isolation structures formed on the substrate; forming a silicon-on-insulator (SOI) region over a portion of the BOX layer between the pair of isolation structures; forming first and second RMGs, laterally separated, over and perpendicular to the SOI region; recessing the SOI region between the first and second RMGs down to the BOX layer, forming at least one trench; forming at least one third RMG perpendicular to the SOI region in the at least one trench; forming a S/D region in the SOI region adjacent to the first and second RMGs, respectively, remote from the at least one third RMG; utilizing each of the first and second RMGs as a WL; utilizing the at least one third RMG as a SL or connecting a SL to the S/D region; and connecting a BL to the S/D region or the at least one third RMG.

Aspects of the present disclosure include forming the first, second, and at least one third RMGs by: forming first and second dummy gates, laterally separated, over and perpendicular to the SOI region; forming at least one third dummy gate between the first and second dummy gates, over and perpendicular to the SOI region; forming an L-shaped liner on each sidewall of each first, second, and third dummy gate; forming a first spacer on each L-shaped liner of the first and second dummy gates; forming a second spacer on each L-shaped liner of each third dummy gate; removing the first, second, and at least one third dummy gates between the respective L-shaped liners subsequent to forming the S/D region, forming a second, a third, and the at least one trench, respectively; and forming the first, the second, and the at least one third RMG in the second, third, and at least one trench, respectively. Other aspects include separating the second spacers from the first spacers; and forming source/drain regions between the third dummy gate and the adjacent first and second dummy gates. Further aspects include forming the first and second spacers with no gap in between. Additional aspects include forming at least one additional SOI region parallel to and vertically spaced from the SOI region; extending the first and second RMGs over one or more of the additional SOI regions, respectively; recessing the one or more of the additional SOI regions between the first and second RMGs down to the BOX layer, forming one or more additional trenches; extending the at least one third RMG between the one or more of the additional SOI regions through the one or more additional trenches. Another aspect includes forming at least one additional SOI region parallel to and vertically spaced from the SOI region; extending the first and second RMGs over one or more of the additional SOI regions, respectively; recessing the one or more of the additional SOI regions between the first and second RMGs down to the BOX layer, forming one or more additional trenches; and forming an additional at least one third RMG in each of the one or more additional trenches.

A further aspect of the present disclosure is a device including: a substrate having a BOX layer formed over the substrate and a cavity formed between the substrate and the box layer and between a pair of isolation structures formed on the substrate; first and second SOI regions formed on the BOX layer end to end with a gap in between, the first and second SOI regions formed between the pair of isolation structures; first and second RMGs, laterally separated, formed over and perpendicular to the first and second SOI regions, respectively; at least one third RMG formed between the first and second RMGs on the BOX layer through the gap; a S/D region formed in each of the first and second SOI regions adjacent to the first and second RMGs, respectively, remote from the at least one third RMG; and a BL connected to the S/D region or the at least one third RMG.

Aspects of the device include each of the first and second RMGs being utilized as a WL and each third RMG being utilized as a SL or a SL being connected to the S/D region. Another aspect includes an L-shaped liner on each sidewall of each first, second, and third RMG; a first spacer on each L-shaped liner of the first and second RMGs; and a second spacer on each L-shaped liner of each third RMG. Other aspects include wherein the second spacers being separated from the first spacers, source/drain regions are formed between the at least one third RMG and the adjacent first and second RMGs. Further aspects include the first and second spacers being formed with no gap in between. Additional aspects include at least one additional pair of first and second SOI regions parallel to and vertically spaced from the first pair of SOI regions, the first and second RMGs extending over one or more of the additional first and second SOI regions, respectively, and the at least one third RMG extending through each additional gap between the one or more of the additional pairs of first and second SOI regions. Another aspect includes at least one additional pair of first and second SOI regions parallel to and vertically spaced from the first pair of SOI regions, the first and second RMGs extending over one or more additional first and second SOI regions, respectively, and an additional at least one third RMG in each additional gap between each of the one or more additional pairs of first and second SOI regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 3A schematically illustrate respective cross-sectional views of compact FinFET OTP/MTP cells having a floating voltage (V) for the unselected BL in program and read modes, in accordance with an exemplary embodiment;

FIGS. 2B and 3B schematically illustrate top views of FIGS. 2A and 3A, respectively;

FIGS. 4A and 5A schematically illustrate respective cross-sectional views of compact FinFET OTP/MTP cells without a floating V for the unselected BL in program and read modes, in accordance with an exemplary embodiment;

FIGS. 4B and 5B schematically illustrate top views of FIGS. 4A and 5A, respectively;

FIGS. 8A and 9A schematically illustrate respective cross-sectional views of compact FinFET OTP/MTP cells having a merged gate without a floating V for the unselected BL in program and read modes, in accordance with an exemplary embodiment;

FIGS. 8B and 9B schematically illustrate top views of FIGS. 8A and 9A, respectively;

FIGS. 10A and 11A schematically illustrate respective cross-sectional views of compact FDSOI OTP/MTP cells having a floating V for the unselected BL in program and read modes, in accordance with another exemplary embodiment;

FIGS. 10B and 11B schematically illustrate top views of FIGS. 10A and 11A, respectively;

FIGS. 12A and 13A schematically illustrate respective cross-sectional views of compact FDSOI OTP/MTP cells without a floating V for the unselected BL in program and read modes, in accordance with another exemplary embodiment; and FIGS. 12B and 13B schematically illustrate top views of FIGS. 12A and 13A, respectively.

DETAILED DESCRIPTION

Figure 1:
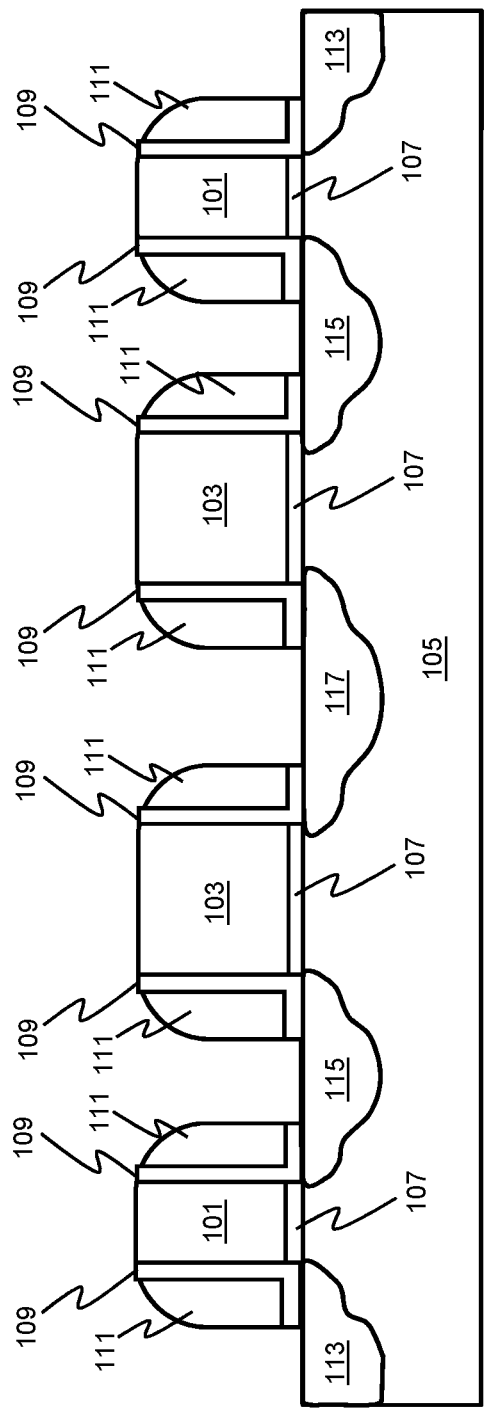
FIG. 1 schematically illustrates a background OTP cell.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of program disturb/interference, overlay margin concerns, relatively large cell size, and circuit design voltage hazards associated with floating V attendant upon forming OTP/MTP cells.

Methodology in accordance with embodiments of the present disclosure includes providing a substrate having a BOX layer formed over the substrate. First and second fins are formed on the BOX layer end to end with a gap in between. First and second gates, laterally separated, are formed over and perpendicular to the first and second fins, respectively. At least one third gate is formed between the first and second gates and contacting the BOX layer through the gap, each third gate overlapping an end of the first fin, the second fin, or both fins. A S/D region is formed in each of the first and second fins adjacent to the first and second gates, respectively, remote from the at least one third gate. Each of the first and second gates is utilized as a SL, each at least one third gate is utilized as a SL or a SL is connected to the S/D region, and a BL is connected to the S/D region or the at least one third gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A and 3A schematically illustrate respective cross-sectional views of compact FinFET OTP/MTP cells having a floating V for the unselected BL in program and read modes along the lines 2A-2A' and 3A-3A' of FIGS. 2B and 3B, respectively, and FIGS. 2B and 3B are top views. Adverting to FIG. 2A, a substrate 201 is provided having a BOX layer 203 formed over the substrate 201. Fins 205 and 207 are formed on the BOX layer 203 end to end with a gap 209 formed in between. Fins 211 and 213 are similarly formed parallel to and vertically spaced from fins 205 and 207, as depicted in FIG. 2B. Additional pairs of fins may also be formed in this manner depending on specific device criteria. Gate 215 is formed over and perpendicular to the fins 205 and 211, and gate 217 is formed over and perpendicular to fins 207 and 213. Gates 219 and 221 are formed between gates 215 and 217. Gate 219 has a portion overlapping fins 205 and 211, gate 221 has a portion overlapping fins 207 and 213, and a remaining portion of each gate contacts the BOX layer 203 through the gap 209. Forming gates 219 and 221 with a portion on the fins 205 and 211 and 207 and 213, respectively, and a remaining portion on the BOX layer 203 allows for less overlay margin concern as the gates 219 and 221 are always in contact with a fin.

An L-shaped liner 223 is formed on each sidewall of gates 215, 217, 219, and 221, a spacer 225 is formed on each L-shaped liner 223 of gates 215 and 217, and a spacer 227 is formed on each L-shaped liner 223 of gates 219 and 221. The distance between the spacers 225 and 227, and thereby the distance between gates 215 and 219 and between gates 221 and 217, as represented by the arrow 229 in FIG. 2B, is 0.07 micrometer (μm) to 0.14 μm, e.g., 0.096 μm. A dielectric layer 231 is formed between each gate 215, 217, 219, and 221 and the underlying fins. A S/D region 233, e.g., n+, is formed adjacent to one side of each of gates 215 and 217, and a S/D region 235, e.g., n+, is formed between gates 215 and 219 and between gates 221 and 217. The S/D regions 233 and 235 may also include optional raised source drain (RSD) formations 237 and 239, respectively. It should be noted that standard silicidation and interlayer dielectric (ILD) formation and chemical mechanical polishing (CMP) steps (not shown for illustrative convenience) are performed after the formation of the S/D regions and optional RSD formations with respect to FIGS. 2A through 13A and 2B through 13B.

Gates 215 and 217 are each utilized as a WL, e.g., $WL_n$ and $WL_{n+1}$, and gates 219 and 221 are each utilized as a SL, e.g., $SL_n$ and $SL_{n+1}$. BL 241 and 243 are connected to the S/D regions 233 through the S/D contacts (CA) 245. Consequently, the size of each bitcell, as represented by the dashed line 247, is 40 $F^2$ to 50 $F^2$, e.g., 43.5 $F^2$, which is smaller than the known 28 nm OTP technology of FIG. 1.

FIGS. 3A and 3B are similar to FIGS. 2A and 2B, except FIGS. 3A and 3B have no S/D region between gates 303 and 305 or between gates 307 and 309 (which correspond with gates 215, 219, 221, and 217), resulting in the width of the bitcell, as represented by the dashed line 301, being narrower than the width of each bitcell in FIGS. 2A and 2B. As with FIGS. 2A and 2B, a substrate 311 is provided having a BOX layer 313 formed over the substrate 311. Fins 315 and 317 are formed on the BOX layer 313 end to end with a gap 319 formed in between. Fins 321 and 323 are similarly formed parallel to and vertically spaced from fins 315 and 317, as depicted in FIG. 3B. Again, additional pairs of fins may also be formed in this manner. Gate 303 is formed over and perpendicular to fins 315 and 321, and gate 309 is formed over and perpendicular to fins 317 and 323. Gates 305 and 307 are formed between gates 303 and 309. Gate 305 has a portion overlapping fins 315 and 321 and gate 307 has a portion overlapping fins 317 and 323, and a remaining portion of each gate contacts the BOX layer 313 through the gap 319.

An L-shaped liner 325 is formed on each sidewall of gates 303, 305, 307, and 309, a spacer 327 is formed on each L-shaped liner 325 of gates 303 and 309, and a spacer 329 is formed on each L-shaped liner 325 of gates 305 and 307. The distance between the spacers 327 and 329, and thereby the distance between gates 303 and 305 and between gates 307 and 309 as represented by the arrow 331 in FIG. 3B, is 0.03 μm to 0.08 μm, e.g., 0.06 μm. A dielectric layer 333 is formed between each gate 303, 305, 307, and 309 and the underlying fins. A S/D region 335, e.g., n+, is formed adjacent to one side of each of gates 303 and 309. The S/D regions 335 may also include optional RSD formations 337.

Gates 303 and 309 are each utilized as a WL, e.g., $WL_n$ and $WL_{n+1}$, and gates 305 and 307 are each utilized as a SL, e.g., $SL_n$ and $SL_{n+1}$. BL 339 and 341 are connected to the S/D regions 335 through the CA 343. Consequently, the size of each bitcell, as represented by the dashed line 301, is 30 $F^2$ to 45 $F^2$, e.g., 36.8 $F^2$, which is smaller than the known 28 nm OTP technology of FIG. 1.

FIGS. 4A and 5A schematically illustrate respective cross-sectional views of compact FinFET OTP/MTP cells without a floating V for the unselected BL in program and read modes along the lines 4A-4A' and 5A-5A' of FIGS. 4B and 5B, respectively, and FIGS. 4B and 5B are top views. FIGS. 4A and 4B are similar to FIGS. 2A and 2B, except that each SL 401 is connected to a S/D region 403, and BL 405 and 407 are connected to gates 409 and 411 and gates 413 and 415, respectively. Thus, the respective directions of the SL and BL relative to FIGS. 2A and 2B are swapped. Similar to FIGS. 2A and 2B, a substrate 417 is provided having a BOX layer 419 formed over the substrate 417. Fins 421 and 423 are formed on the BOX layer 419 end to end with a gap 425 formed in between. Fins 427 and 429 are similarly formed parallel to and vertically spaced from fins 421 and 423, as depicted in FIG. 4B. Again, additional pairs of fins may also be formed in this manner. Gate 431 is formed over and perpendicular to fins 421 and 427, and gate 433 is formed over and perpendicular to fins 423 and 429. Gates 409, 411, 413, and 415 are formed between the gates 431 and 433, each with a portion overlapping fins 421, 423, 427, and 429, respectively, and a remaining portion of each gate contacts the BOX layer 419 through the gap 425.

An L-shaped liner 435 is formed on each sidewall of gates 409, 411, 413, 415, 431, and 433, a spacer 437 is formed on each L-shaped liner 435 of gates 431, and 433, and a spacer 439 is formed on each L-shaped liner 435 of gates 409, 411, 413, and 415. The distance between the spacers 437 and 439, and thereby the distance between gate 431 and gates 409 and 413 and between gate 433 and gates 411 and 415, as represented by the arrow 441 in FIG. 4B, is 0.07 μm to 0.14 μm, e.g., 0.096 μm. A dielectric layer 443 is formed between each gate 409, 411, 413, 415, 431, and 433 and the underlying fins. A S/D region 403, e.g., n+, is formed adjacent to one side of gates 431 and 433, and a S/D region 445, e.g., n+, is formed between gate 431 and gates 409 and 413 and between gate 433 and gates 411 and 415. The S/D regions 403 and 445 may also include optional RSD formations 447 and 449, respectively.

Gates 431 and 433 are each utilized as a WL, e.g., $WL_n$ and $WL_{n+1}$, and the SL 401, e.g., $SL_n$ and $SL_{n+1}$, are each connected to the S/D regions 403 through the CA 451. The BL 405 and 407 are connected to the gates 409 and 411 and gates 413 and 415, respectively, through the gate contacts (CB) 453 and metal layer 455. Alternatively, the CB 453 may be formed as two laterally separated CB 453 and the metal layer 455 may also be formed as two laterally separated metal layers 455 (both not shown for illustrative convenience). Consequently, the size of each bitcell, as represented by the dashed line 457, is the same as in FIGS. 2A and 2B, which is smaller than the known 28 nm OTP technology of FIG. 1. However, the V of the unselected BL 405 and 407 is not floating in program and read modes, e.g., the BL 405 and 407 may be grounded or they may have a certain potential, whereas the V is floating for the unselected BL 241 and 243 in program and read modes in FIGS. 2A and 2B. This comparison is depicted in the Tables A (OTP), B (MTP), C (OTP), and D (MTP), respectively, below. It should be noted that the bias properties for FIGS. 2A, 6A, and 10A are the same for FIGS. 3A, 7A, and 11A, and the bias properties for FIGS. 4A, 8A, and 12A are the same for FIGS. 5A, 9A, and 13A. It should also be noted that the bias properties depicted in Tables A, B, C, and D are provided for illustration and are not intended as a limitation. By avoiding the floating voltage of the unselected BL in program and read modes, the circuit design hazards associated with floating V can be avoided; leading to fewer circuit design complications.

TABLE A

| OTP Bias Table (FIGS. 4A, 8A, and 12A) | | WL (V) | BL (V) | SL (V) |
|---|---|---|---|---|
| Prog. | Sel. | 0.6-1.2 | 2-4 | 0 |
| | Unsel. | 0 | 0 | 0 |
| Read | Sel. | VDD | VDD | 0 |
| | Unsel. | 0 | 0 | 0 |

TABLE B

| MTP Bias Table (FIGS. 4A, 8A, and 12A) | | WL (V) | SL (V) | BL (V) |
|---|---|---|---|---|
| Prog. (Set/Forming) | Sel. | 0.6-1.2 | 2-4 | 0 |
| | Unsel. | 0 | 0 | 0 |
| Erase (Unipolar Reset) | Sel. | 1-1.5 | 1-2 | 0 |
| | Unsel. | 0 | 0 | 0 |
| Erase (Bipolar Reset) | Sel. | 1-1.5 | 0 | 1-2 |
| | Unsel. | 0 | 0 | 0 |
| Read | Sel. | VDD | VDD | 0 |
| | Unsel. | 0 | 0 | 0 |

TABLE C

| OTP Bias Table (FIGS. 2A, 6A, and 10A) | | WL (V) | SL (V) | BL (V) |
|---|---|---|---|---|
| Prog. | Sel. | 0.6-1.2 | 2-4 | 0 |
|  | Unsel. | 0 | 0 | F |
| Read | Sel. | VDD | VDD | 0 |
|  | Unsel. | 0 | 0 | F |

TABLE D

| MTP Bias Table (FIGS. 2A, 6A, and 10A) | | WL (V) | SL (V) | BL (V) |
|---|---|---|---|---|
| Prog. (Set/Forming) | Sel. | 0.6-1.2 | 2-4 | 0 |
|  | Unsel. | 0 | 0 | F |
| Erase (Unipolar Reset) | Sel. | 1-1.5 | 1-2 | 0 |
|  | Unsel. | 0 | 0 | F |
| Erase (Bipolar Reset) | Sel. | 1-1.5 | 0 | 1-2 |
|  | Unsel. | 0 | 0 | F |
| Read | Sel. | VDD | VDD | 0 |
|  | Unsel. | 0 | 0 | F |

FIGS. 5A and 5B like in FIGS. 3A and 3B are similar to FIGS. 4A and 4B, except that the width of each bitcell, as represented by the dashed line 501, is narrower than the width of each bitcell in FIGS. 4A and 4B as a result of the omission of a S/D region between gate 503 and gates 505 and 507 and between gate 509 and gates 511 and 513. As with FIGS. 4A and 4B, a substrate 515 is provided having a BOX layer 517 formed over the substrate 515. Fins 519 and 521 are formed on the BOX layer 517 end to end with a gap 523 formed in between. Fins 525 and 527 are similarly formed parallel to and vertically spaced from fins 519 and 521, as depicted in FIG. 5B. Again, additional pairs of fins may also be formed in this manner. Gate 503 is formed over and perpendicular to fins 519 and 525, and gate 509 is formed over and perpendicular to fins 521 and 527. Gates 505, 511, 507, and 513 are formed between the gates 503 and 509, each with a portion overlapping fins 519, 521, 525, and 527, respectively, and a remaining portion contacts the BOX layer 517 through the gap 523.

An L-shaped liner 529 is formed on each sidewall of gates 503, 505, 507, 509, 511, and 513, a spacer 531 is formed on each L-shaped liner 529 of gates 503 and 509, and a spacer 533 is formed on each L-shaped liner 529 of gates 505, 507, 511, and 513. The distance between the spacers 531 and 533 and thereby the distance between gate 503 and gates 505 and 507 and between gate 509 and gates 511 and 513, as represented by the arrow 535 in FIG. 5B, is 0.03 μm to 0.08 μm, e.g., 0.06 μm. A dielectric layer 537 is formed between each gate 503, 505, 507, 509, 511, and 513 and the underlying fins. A S/D region 539, e.g., n+, is formed adjacent to one side of each of gates 503 and 509. The S/D regions 539 may also include optional RSD formations 541.

Gates 503 and 509 are each utilized as a WL, e.g., $WL_n$ and $WL_{n+1}$, and the SL 543, e.g., $SL_n$ and $SL_{n+1}$, are each connected to the S/D regions 539 through the CA 545. The BL 547 and 549 are connected to the gates 505 and 511 and gates 507 and 513, respectively, through the CB 551 and metal layer 553. Again, the CB 551 may alternatively be formed as two laterally separated CB 551 and the metal layer 553 may also be formed as two laterally separated metal layers 553 (both not shown for illustrative convenience). Consequently, the size of each bitcell, as represented by the dashed line 501, is the same as in FIGS. 3A and 3B, which is smaller than the known 28 nm OTP technology of FIG. 1. However, the V of the unselected BL 547 and 549 is not floating in program and read modes, e.g., the BL 547 and 549 may be grounded or they may have a certain potential, whereas the V is floating for the unselected BL 339 and 341 in program and read modes in FIGS. 3A and 3B.

Figure 6B:
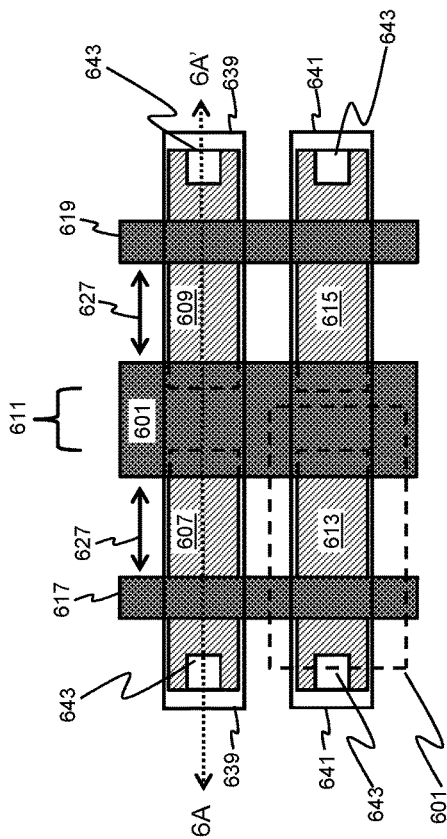
FIGS. 6B and 7B schematically illustrate top views of FIGS. 6A and 7A, respectively.
Figure 6A:
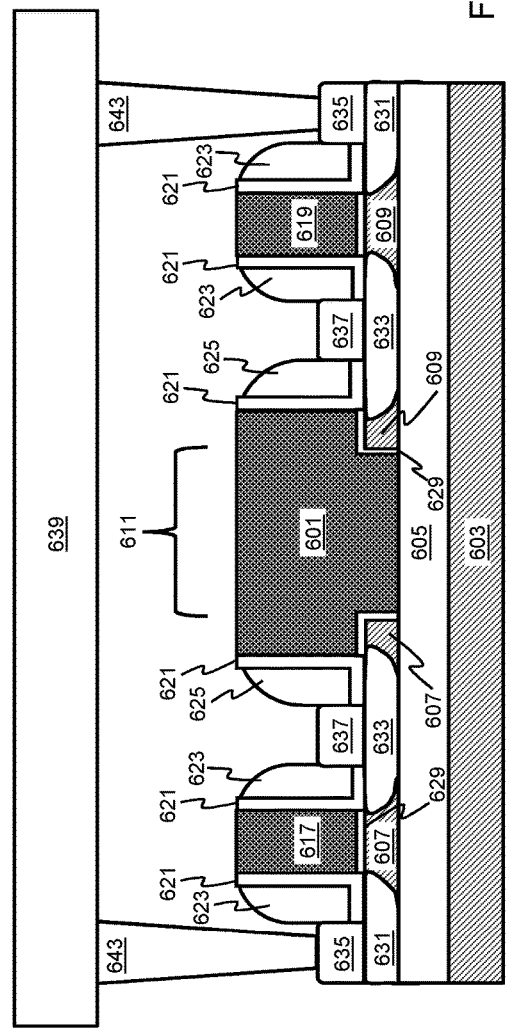
FIGS. 6A and 7A schematically illustrate respective cross-sectional views of compact FinFET OTP/MTP cells having a merged gate and a floating V for the unselected BL in program and read modes, in accordance with an exemplary embodiment.
Figure 7B:
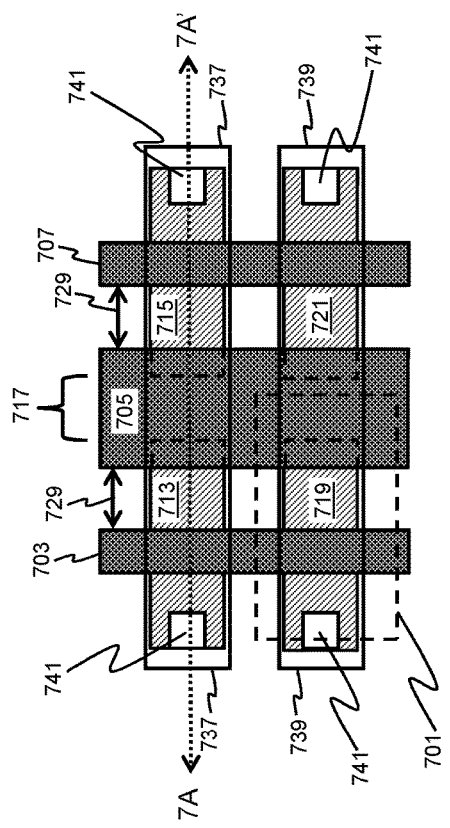
Figure 7A:
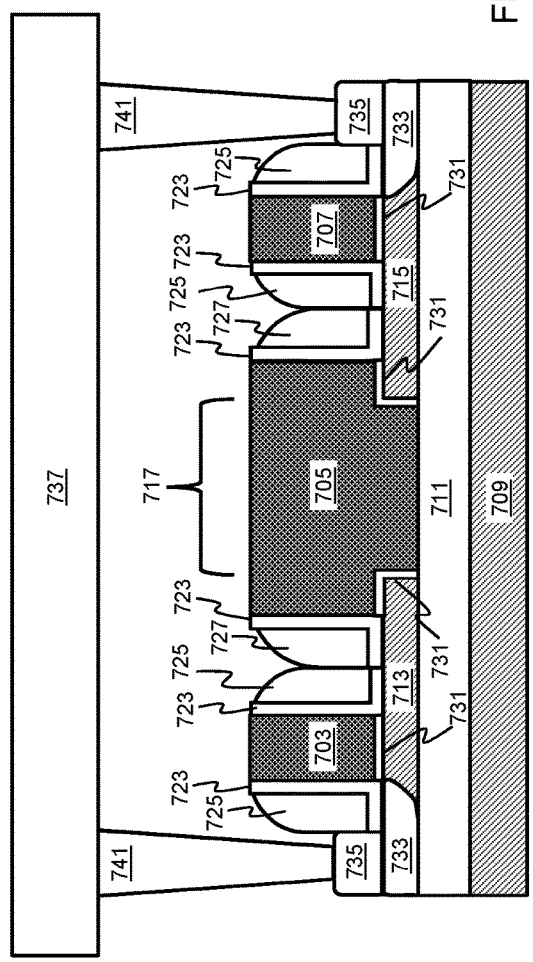

FIGS. 6A and 7A schematically illustrate respective cross-sectional views of compact FinFET OTP/MTP cells having a merged gate and a floating V for the unselected BL in program and read modes along the lines 6A-6A' and 7A-7A' of FIGS. 6B and 7B, respectively, and FIGS. 6B and 7B are top views. FIGS. 6A and 6B are similar to FIGS. 2A and 2B, except that the gates 219 and 221 are merged into a single gate 601. Similar to FIGS. 2A and 2B, a substrate 603 is provided having a BOX layer 605 formed over the substrate 603. Fins 607 and 609 are formed on the BOX layer 605 end to end with a gap 611 formed in between. Fins 613 and 615 are similarly formed parallel to and vertically spaced from fins 607 and 609, as depicted in FIG. 6B. Again, one or more additional pairs of fins may also be formed in this manner. Gate 617 is formed over and perpendicular to fins 607 and 613, and gate 619 is formed over and perpendicular to fins 609 and 615. Gate 601 is formed between gates 617 and 619, with a portion overlapping each of fins 607, 609, 613, and 615 and a remaining portion contacts the BOX layer 605 through the gap 611. Again, forming gate 601 with a portion on each fin 607, 609, 613, and 615 and a remaining portion contacting the BOX layer 605 allows for less overlay margin concern as the gate 601 is always in contact with a fin.

An L-shaped liner 621 is formed on each sidewall of gates 601, 617, and 619, a spacer 623 is formed on each L-shaped liner 621 of gates 617 and 619, and a spacer 625 is formed on each L-shaped liner 621 of gate 601. The distance between the spacers 623 and 625 and thereby the distance between gates 617 and 601 and 619 and 601, as represented by the arrow 627 in FIG. 6B, is 0.07 μm to 0.14 μm, e.g., 0.096 μm. A dielectric layer 629 is formed between each gate 601, 617, and 619 and the underlying fins. A S/D region 631, e.g., n+, is formed adjacent to one side of each of gates 617 and 619, and a S/D region 633, e.g., n+, is formed between gates 617 and 601 and between gates 619 and 601. The S/D regions 631 and 633 may also include optional RSD formations 635 and 637, respectively.

Gates 617 and 619 are each utilized as a WL, e.g., $WL_n$ and $WL_{n+1}$, and gate 601 is utilized as a SL, e.g., $SL_n/SL_{n+1}$. BL 639 and 641 are connected to the S/D regions 631 through the CA 643. Consequently, the size of each bitcell, as represented by the dashed line 601, is 30 $F^2$ to 50 $F^2$, e.g., 41.7 $F^2$, which is smaller than the known 28 nm OTP technology of FIG. 1.

FIGS. 7A and 7B are similar to FIGS. 6A and 6B, except that the width of each bitcell, as represented by the dashed line 701, is narrower than the width of each bitcell in FIGS. 6A and 6B as a result of the omission of a S/D region between gates 703 and 705 and between gates 707 and 705. As with FIGS. 6A and 6B, a substrate 709 is provided having a BOX layer 711 formed over the substrate 709. Fins 713 and 715 are formed on the BOX layer 711 end to end with a gap 717 formed in between. Fins 719 and 721 are similarly formed parallel to and vertically spaced from fins 713 and 715, as depicted in FIG. 7B. Again, one or more additional pairs of fins may also be formed in this manner. Gate 703 is formed over and perpendicular to fins 713 and 719, and gate 707 is formed over and perpendicular to fins 715 and 721. Gate 705 is formed between gates 703 and 707, with a portion overlapping each of fins 713, 715, 719, and 721, and a remaining portion contacts the BOX layer 711 through the gap 717.

An L-shaped liner 723 is formed on each sidewall of gates 703, 705, and 707, a spacer 725 is formed on each L-shaped liner 723 of gates 703 and 705, and a spacer 727 is formed on each L-shaped liner 723 of gate 705. The distance between the spacers 725 and 727, and thereby the distance between gates 703 and 705 and gates 707 and 705, as represented by the arrow 729 in FIG. 7B, is 0.03 µm to 0.08 µm, e.g., 0.06 µm. A dielectric layer 731 is formed between each gate 703, 705, and 707 and the underlying fins. A S/D region 733, e.g., n+, is formed adjacent to one of each of gates 703 and 707. The S/D regions 733 may also include optional RSD formations 735.

Gates 703 and 707 are each utilized as a WL, e.g., $WL_n$ and $WL_{n+1}$, and gate 705 is utilized as a SL, e.g., $SL_n/SL_{n+1}$. BL 737 and 739 are connected to the S/D regions 733 through the CA 741. Consequently, the size of each bitcell, as represented by the dashed line 701, is 30 $F^2$ to 45 $F^2$, e.g., 35 $F^2$, which is smaller than the known 28 nm OTP technology of FIG. 1.

FIGS. 8A and 9A schematically illustrate respective cross-sectional views of compact FinFET OTP/MTP cells having a merged gate without a floating V for the unselected BL in program and read modes along the lines 8A-8A' and 9A-9A' of FIGS. 8B and 9B, respectively, and FIGS. 8B and 9B are top views. FIGS. 8A and 8B are similar to FIGS. 6A and 6B, except that each SL 801 is connected to a S/D region 803, and BL 805 and 807 are connected to gates 809 and 811, respectively. Similar to FIGS. 6A and 6B, a substrate 813 is provided having a BOX layer 815 formed over the substrate 813. Fins 817 and 819 are formed on the BOX layer 815 end to end with a gap 821 formed in between. Fins 823 and 825 are similarly formed parallel to and vertically spaced from fins 817 and 819, as depicted in FIG. 8B. Again, one or more additional pairs of fins may also be formed in this manner. Gate 827 is formed over and perpendicular to fins 817 and 823, and gate 829 is formed over and perpendicular to fins 819 and 825. Gates 809 and 811 are formed between the gates 827 and 829, each with a portion overlapping fins 817 and 819 and fins 823 and 825, respectively, and a remaining portion of each gate contacts the BOX layer 815 through the gap 821.

An L-shaped liner 831 is formed on each sidewall of gates 809, 811, 827, and 829, a spacer 833 is formed on each L-shaped liner 831 of gates 827 and 829, and a spacer 835 is formed on each L-shaped liner 831 of gates 809 and 811. The distance between the spacers 833 and 835, and thereby the distance between gate 827 and gates 809 and 811 and between gate 829 and gates 809 and 811, as represented by the arrow 837 in FIG. 8B, is 0.07 µm to 0.14 µm, e.g., 0.096 µm. A dielectric layer 839 is formed between each gate 809, 811, 827, and 829 and the underlying fins. A S/D region 803, e.g., n+, is formed adjacent to one side of each of gates 827 and 829, and a S/D region 841, e.g., n+, is formed between gate 827 and gates 809 and 811 and between gate 829 and gates 809 and 811. The S/D regions 803 and 841 may also include optional RSD formations 843 and 845, respectively.

Gates 827 and 829 are each utilized as a WL, e.g., $WL_n$ and $WL_{n+1}$, and the SL 801, e.g., $SL_n$ and $SL_{n+1}$, are each connected to the S/D regions 803 through the CA 847. The BL 805 and 807 are connected to the gates 809 and 811, respectively, through the CB 849 and metal layer 851. Consequently, the size of each bitcell, as represented by the dashed line 853, is the same as FIGS. 6A and 6B, which is smaller than the known 28 nm OTP technology of FIG. 1. However, the V of the unselected BL 805 and 807 is not floating in program and read modes, e.g., the BL 805 and 807 may be grounded or they may have a certain potential, whereas the V is floating for the unselected BL 639 and 641 in program and read modes in FIGS. 6A and 6B, as depicted in the Tables A (OTP), B (MTP), C (OTP), and D (MTP), respectively, above.

FIGS. 9A and 9B are similar to FIGS. 8A and 8B, except that the width of each bitcell, as represented by the dashed line 901, is narrower than the width of each bitcell in FIGS. 8A and 8B as a result of the omission of a S/D region between gate 903 and gates 905 and 907 and between gate 909 and gates 905 and 907. Similar to FIGS. 8A and 8B, a substrate 911 is provided having a BOX layer 913 formed over the substrate 911. Fins 915 and 917 are formed on the BOX layer 913 end to end with a gap 919 formed in between. Fins 921 and 923 are similarly formed parallel to and vertically spaced from fins 915 and 917, as depicted in FIG. 9B. Again, one or more additional pairs of fins may also be formed in this manner. Gate 903 is formed over and perpendicular to fins 915 and 921, and gate 909 is formed over and perpendicular to fins 917 and 923. Gates 905 and 907 are formed between the gates 903 and 909. Gate 905 has a portion overlapping fins 915 and 917, gate 907 has a portion overlapping fins 921 and 923, respectively, and a remaining portion of gates 905 and 907 contacts the BOX layer 913 through the gap 919.

An L-shaped liner 925 is formed on each sidewall of gates 903, 905, 907, and 909, a spacer 927 is formed on each L-shaped liner 925 of gates 903 and 909, and a spacer 929 is formed on each L-shaped liner 925 of gates 905 and 907. The distance between the spacers 927 and 929, and thereby the distance between gate 903 and gates 905 and 907 and between gate 909 and gates 905 and 907, as represented by the arrow 931 in FIG. 9B, is 0.03 µm to 0.08 µm, e.g., 0.06 µm. A dielectric layer 933 is formed between each gate 903, 905, 907, and 909 and the underlying fins. A S/D region 935, e.g., n+, is formed adjacent to one side of each of gates 903 and 909. The S/D regions 935 may also include optional RSD formations 937.

Gates 903 and 909 are each utilized as a WL, e.g., $WL_n$ and $WL_{n+1}$, and the SL 939, e.g., $SL_n$ and $SL_{n+1}$, are each connected to the S/D regions 935 through the CA 941. The BL 943 and 945 are connected to the gates 905 and 907, respectively, through the CB 947 and metal layer 949. Further, the V of the unselected BL 947 and 949 is not floating in program and read modes, e.g., the BL 947 and 949 may be grounded or they may have a certain potential, whereas the V is floating for the unselected BL 737 and 739 in program and read modes in FIGS. 7A and 7B. Although FIGS. 2A through 9A and 2B through 9B are described with respect to a standard gate formation process, alternatively, dummy gates may be initially formed and then replaced with RMGs following standard RMG formation processes.

FIGS. 10A and 11A schematically illustrate respective cross-sectional views of compact FDSOI OTP/MTP cells having a floating V for the unselected BL in program and read modes along the lines 10A-10A' and 11A-11A' of FIGS. 10B and 11B, respectively, and FIGS. 10B and 11B are top views. Adverting to FIG. 10A, a substrate 1001 is provided having a BOX layer 1003 formed over the substrate 1001 and a cavity 1004 formed between the substrate 1001 and the BOX layer 1003 and between a pair of bulk-like isolation structures 1006 formed on the substrate 1001. A SOI region 1005 is formed between the isolation structures 1006. A SOI region 1007 is similarly formed parallel to and vertically spaced from the SOI region 1005, as depicted in FIG. 10B. Additional SOI regions may also be formed in this manner. RMGs 1009 and 1011 are formed, e.g., using standard dummy gate formation and replacement steps, laterally separated, over and perpendicular to the SOI regions 1005 and 1007, respectively. A central portion of the SOI regions 1005 and 1007 between the RMGs 1009 and 1011 is recessed down to the BOX layer 1003, forming a trench 1017. A RMG 1013 is formed perpendicular to the SOI regions 1005 and 1007 on the BOX layer 1003 through the trench 1017.

RMGs 1009, 1011, and 1013 each include an L-shaped liner 1019 on each side and a U-shaped work-function metal layer 1021. RMGs 1009 and 1011 also include a spacer 1023 formed on each L-shaped liner 1019, and the RMG 1013 includes a spacer 1025 formed on each L-shaped liner 1019. The distance between the spacers 1023 and 1025, and thereby the distance between RMG 1009 and RMG 1013 and between RMG 1011 and RMG 1013, as represented by the arrow 1027 in FIG. 10B, is 0.07 µm to 0.14 µm, e.g., 0.096 µm. A S/D region 1029, e.g., n+, is formed adjacent to one side of each of RMGs 1009 and 1011, and a S/D region 1031, e.g., n+, is formed between RMGs 1009 and 1013 and between RMGs 1011 and 1013. The S/D regions 1029 and 1031 may also include optional RSD formations 1033 and 1035, respectively.

RMGs 1009 and 1011 are each utilized as a WL, e.g., $WL_n$ and $WL_{n+1}$, and the RMG 1013 is utilized as a SL, e.g., $SL_n/SL_{n+1}$. BL 1037 and 1039 are connected to the S/D regions 1029 through the CA 1041. Consequently, the size of each bitcell, as represented by the dashed line 1043, is approximately 30 $F^2$ to 45 $F^2$, e.g., 35.1 $F^2$, which is smaller than the known 28 nm OTP technology of FIG. 1.

FIGS. 11A and 11B are similar to FIGS. 10A and 10B, except that the width of each bitcell, as represented by the dashed line 1101, is narrower than the width of each bitcell in FIGS. 10A and 10B as a result of the omission of a S/D region between RMGs 1103 and 1105 and between RMGs 1107 and 1105. As with FIGS. 10A and 10B, a substrate 1109 is provided having a BOX layer 1111 formed over the substrate 1109 and a cavity 1112 formed between the substrate 1109 and the BOX layer 1111 and between a pair of bulk-like isolation structures 1114 formed on the substrate 1109. A SOI region 1113 is formed between the isolation structures 1114. A SOI region 1115 is similarly formed parallel to and vertically spaced from the SOI region 1113, as depicted in FIG. 11B. One or more additional SOI regions may also be formed in this manner. RMGs 1103 and 1107 are formed, e.g., using standard dummy gate formation and replacement steps, laterally separated, over and perpendicular to the SOI regions 1113 and 1115, respectively. A central portion of the SOI regions 1113 and 1115 between the RMGs 1103 and 1105 is recessed down to the BOX layer 1111, forming a trench 1117. The RMG 1105 is formed perpendicular to the SOI regions 1113 and 1115 on the BOX layer 1111 through the trench 1017.

RMGs 1103, 1105, and 1107 each include an L-shaped liner 1119 on each side and a U-shaped work-function metal layer 1121. RMGs 1103 and 1107 also include a spacer 1123 formed on each L-shaped liner 1119, and the RMG 1105 includes a spacer 1125 formed on each L-shaped liner 1119. The distance between the spacers 1123 and 1125, and thereby the distance between RMGs 1103 and 1105 and between RMGs 1107 and 1105, as represented by the arrow 1127 in FIG. 11B, is 0.03 µm to 0.08 µm, e.g., 0.06 µm. A S/D region 1129, e.g., n+, is formed adjacent to one side of each of RMGs 1103 and 1107. The S/D regions 1129 may also include optional RSD formations 1131.

RMGs 1103 and 1107 are each utilized as a WL, e.g., WL, e.g., $WL_n$ and $WL_{n+1}$, and the RMG 1105 is utilized as a SL, e.g., $SL_n/SL_{n+1}$. BL 1133 and 1135 are connected to the S/D regions 1129 through the CA 1137. Consequently, the size of each bitcell, as represented by the dashed line 1101, is approximately 25 $F^2$ to 35 $F^2$, e.g., 28.5 $F^2$, which is smaller than the known 28 nm OTP technology of FIG. 1.

FIGS. 12A and 13A schematically illustrate respective cross-sectional views of compact FDSOI OTP/MTP cells having a grounded V for the unselected BL in program and read modes along the lines 12A-12A' and 13A-13A' of FIGS. 12B and 13B, respectively, and FIGS. 12B and 13B are top views. FIGS. 12A and 12B are similar to FIGS. 10A and 10B, except that each SL 1201, e.g., $SL_n$ and $SL_{n+1}$, is connected to an S/D region 1203, and BL 1205 and 1207 are connected to RMGs 1209 and 1211, respectively. Similar to FIGS. 10A and 10B, a substrate 1213 is provided having a BOX layer 1215 formed over the substrate 1213 and a cavity 1214 formed between the substrate 1213 and the BOX layer 1215 and between a pair of bulk-like isolation structures 1218 formed on the substrate 1213. A SOI region 1217 is formed between the isolation structures 1218. A SOI region 1219 is similarly formed parallel to and vertically spaced from the SOI region 1217, as depicted in FIG. 12B. One or more additional SOI regions may also be formed in this manner. RMGs 1221 and 1223 are formed, e.g., using standard dummy gate formation and replacement steps, laterally separated, over and perpendicular to the SOI regions 1217 and 1219, respectively. A central portion of the SOI regions 1217 and 1219 between the RMGs 1221 and 1223 is recessed down to the BOX layer 1215, forming a trench 1225. The RMGs 1209 and 1211 are formed perpendicular to the SOI regions 1217 and 1219, respectively, on the BOX layer 1215 through the trench 1225.

RMGs 1209, 1211, 1221, and 1223 each include an L-shaped liner 1227 on each side and a U-shaped work-function metal layer 1229. RMGs 1221 and 1223 also include a spacer 1231 formed on each L-shaped liner 1227, and the RMGs 1209 and 1211 include a spacer 1233 formed on each L-shaped liner 1227. The distance between the spacers 1231 and 1233, and thereby the distance between RMG 1221 and RMGs 1209 and 1211 and between RMG 1223 and RMGs 1209 and 1211, as represented by the arrow 1235 in FIG. 12B, is 0.03 µm to 0.08 µm, e.g., 0.06 µm. A S/D region 1203, e.g., n+, is formed adjacent to one side of each of RMGs 1221 and 1223, and a S/D region 1237, e.g., n+, is formed between RMG 1221 and RMGs 1209 and 1211 and between RMG 1223 and RMGs 1209 and 1211. The S/D regions 1203 and 1237 may also include optional RSD formations 1239 and 1241, respectively.

RMGs 1221 and 1223 are each utilized as a WL, e.g., $WL_n$ and $WL_{n+1}$, and the SL 1201, e.g., $SL_n$ and $SL_{n+1}$, are each connected to the S/D regions 1203 through the CA 1243. The BL 1205 and 1207 are connected to the gates 1209 and 1211, respectively, through the CB 1245 and metal layer 1247. Consequently, the size of each bitcell, as represented by the dashed line 1249, is the same as in FIGS. 10A and 10B, which is smaller than the known 28 nm OTP technology of FIG. 1. However, the V of the unselected BL 1205 and 1207 is not floating in program and read modes, e.g., the BL 1205 and 1207 may be grounded or they may have a certain potential, whereas the V is floating for the unselected BL 1037 and 1039 in program and read modes in FIGS. 10A and 10B, as depicted in the Tables A (OTP), B (MTP), C (OTP), and D (MTP), respectively, above.

FIGS. 13A and 13B are similar to FIGS. 12A and 12B, except that the width of each bitcell, as represented by the dashed line 1301, is narrower than the width of each bitcell in FIGS. 12A and 12B as a result of the omission of a S/D region between RMG 1303 and RMGs 1305 and 1307 and between RMG 1309 and RMGs 1305 and 1307. As with FIGS. 12A and 12B, a substrate 1311 is provided having a BOX layer 1313 formed over the substrate 1311 and a cavity 1314 formed between the substrate 1311 and the BOX layer 1313 and between a pair of bulk-like isolation structures 1316 formed on the substrate 1311. A SOI region 1315 is formed between the isolation structures 1316. A SOI region 1317 is similarly formed parallel to and vertically spaced from the SOI region 1315, as depicted in FIG. 13B. One or more additional SOI regions may also be formed in this manner. RMGs 1303 and 1309 are formed, e.g., using standard dummy gate formation and replacement steps, laterally separated, over and perpendicular to the SOI regions 1315 and 1317. A central portion of the SOI regions 1315 and 1317 between the RMGs 1303 and 1309 is recessed down to the BOX layer 1313, forming a trench 1319. The RMGs 1305 and 1307 are formed perpendicular to the SOI regions 1315 and 1317 on the BOX layer 1313 through the trench 1319.

RMGs 1303, 1305, 1307, and 1309 each include an L-shaped liner 1321 on each side and a U-shaped workfunction metal layer 1323. RMGs 1303 and 1309 also each include a spacer 1325 formed on each L-shaped liner 1321, and the RMGs 1305 and 1307 each include a spacer 1327 formed on each L-shaped liner 1321. The distance between the spacers 1325 and 1327, and thereby the distance between RMG 1303 and RMGs 1305 and 1307 and between RMG 1309 and RMGs 1305 and 1307, as represented by the arrow 1329 in FIG. 13B, is 0.03 μm to 0.08 μm, e.g., 0.06 μm. A S/D region 1331, e.g., n+, is formed adjacent to one side of each of RMGs 1303 and 1309. The S/D regions 1331 may also include optional RSD formations 1333.

Gates 1303 and 1309 are each utilized as a WL, e.g., $WL_n$ and $WL_{n+1}$, and the SL 1335, e.g., $SL_n$ and $SL_{n+1}$, are each connected to the S/D regions 1331 through the CA 1337. The BL 1339 and 1341 are connected to the gates 1305 and 1307, respectively, through the CB 1343 and metal layer 1345. Consequently, the size of each bitcell, as represented by the dashed line 1301, is the same as in FIGS. 11A and 11B, which is smaller than the known 28 nm OTP technology of FIG. 1. However, the V of the unselected BL 1339 and 1341 is not floating in program and read modes, e.g., the BL 1339 and 1341 may be grounded or they may have a certain potential, whereas the V is floating for the unselected BL 1133 and 1135 in program and read modes in FIGS. 11A and 11B.

The embodiments of the present disclosure can achieve several technical effects including alleviating disturb/interference using a compact OTP/MTP memory cell that can be implemented in both FinFET and FDSOI technologies as well as potentially reducing circuit design hazards associated with floating voltages. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with OTP or MTP memory devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a substrate having a buried oxide (BOX) layer formed over the substrate;
   forming first and second fins on the BOX layer, wherein the second fin is arranged opposite the first fin on the BOX layer such that an end of the second fin is aligned to an end of the first fin with a gap in between;
   forming first and second gates, laterally separated, over and perpendicular to the first and second fins, respectively;
   forming at least one third gate between the first and second gates and contacting the BOX layer through the gap, each third gate overlapping an end of the first fin, the second fin, or both fins;
   forming at least one additional pair of separated first and second fins parallel to and vertically spaced from the first and second fins;
   extending the first and second gates over one or more of the additional first and second fins, respectively;
   forming a source/drain (S/D) region in each of the first and second fins adjacent to the first and second gates, respectively, remote from the at least one third gate;
   utilizing each of the first and second gates as a word line (WL);
   utilizing each at least one third gate as a source line (SL) or connecting a SL to the S/D region; and
   connecting a bit line (BL) to the S/D region or the at least one third gate.

2. The method according to claim 1, wherein the at least one third gate comprises two third gates separated from each other.

3. The method according to claim 2, comprising:
   forming an L-shaped liner on each sidewall of each first, second, and third gate;
   forming a first spacer on each L-shaped liner of the first and second gates; and
   forming a second spacer on each L-shaped liner of each third gate.

4. The method according to claim 3, comprising:
   separating the second spacers from the first spacers; and
   forming source/drain regions between each third gate and the adjacent first and second gates.

5. The method according to claim 3, comprising forming the first and second spacers with no gap in between.

6. The method according to claim 1, wherein the at least one third gate comprises a single merged gate filling the gap and overlapping an end of each of the first and second fins.

7. The method according to claim 1, further comprising:
   extending the at least one third gate over the one or more additional pairs of first and second fins.

8. The method according to claim 1, further comprising:
   forming an additional at least one third gate over each of the one or more additional pairs of first and second fins.

9. A device comprising:
   a substrate having a buried oxide (BOX) layer formed over the substrate;
   first and second fins formed on the BOX layer, wherein the second fin is arranged opposite the first fin on the BOX layer such that an end of the second fin is aligned to an end of the first fin with a gap in between;

first and second gates, laterally separated, formed over and perpendicular to the first and second fins, respectively;

at least one third gate formed between the first and second gates on the BOX layer through the gap, each third gate overlapping an end of the first fin, the second fin, or both fins;

at least one additional pair of separated first and second fins formed parallel to and vertically spaced from the first and second fins, wherein the first and second gates extend over one or more of the additional first and second fins, respectively;

a source/drain (S/D) region formed in each of the first and second fins adjacent to the first and second gates, respectively, remote from the at least one third gate; and a bit line (BL) connected to the S/D region or the third gate.

10. The device according to claim 9, wherein each of the first and second gates are utilized as a word line (WL) and each third gate is utilized as a source line (SL) or a SL is connected to the S/D region.

11. The device according to claim 9, wherein the at least one third gate comprises two third gates separated from each other.

12. The device according to claim 11, further comprising:

an L-shaped liner on each sidewall of each first, second, and third gate;

a first spacer on each L-shaped liner of the first and second gates; and a second spacer on each L-shaped liner of each third gate.

13. The device according to claim 12, wherein the second spacers are separated from the first spacers, the device further comprising source/drain regions formed between each third gate and the adjacent first and second gates.

14. The device according to claim 12, wherein the first and second spacers are formed with no gap in between.

15. The device according to claim 9, wherein the at least one third gate comprises a single merged gate filling the gap and overlapping an end of each of the first and second fins.

16. The device according to claim 9, further comprising the at least one third gate extending over the one or more additional pairs of first and second fins.

17. The device according to claim 9, further comprising an additional at least one third gate over each of the one or more additional pairs of first and second fins.

* * * * *